(12) United States Patent
Fang

(10) Patent No.: US 6,533,849 B1
(45) Date of Patent: Mar. 18, 2003

(54) ELECTROLESS GOLD PLATED ELECTRONIC COMPONENTS AND METHOD OF PRODUCING THE SAME

(75) Inventor: Jing Li Fang, Singapore (SG)

(73) Assignee: Gul Technologies Singapore LTD (SG)

( * ) Notice: Subject to any disclaimer, the term of this patent is extended or adjusted under 35 U.S.C. 154(b) by 97 days.

(21) Appl. No.: 09/723,155

(22) Filed: Nov. 27, 2000

(30) Foreign Application Priority Data

Dec. 1, 1999 (SG) .......................................... 9906051-9

(51) Int. Cl.$^7$ .......................... C23C 18/42; C23C 18/44; C23C 18/54; H01B 1/02
(52) U.S. Cl. .................... 106/1.23; 106/1.05; 106/1.13; 106/1.18; 106/1.23; 106/1.26; 427/437; 427/96; 427/98; 427/123; 427/125; 427/436; 204/434; 205/266; 445/52; 445/58; 252/514
(58) Field of Search .......................... 204/434; 427/437, 427/98, 123, 125, 96, 436; 445/52, 58; 106/1.23, 1.26, 1.05, 1.13, 1.18; 252/514; 205/266

(56) References Cited

U.S. PATENT DOCUMENTS

| | | | | |
|---|---|---|---|---|
| 4,238,300 A | * | 12/1980 | Yoshida | 205/266 |
| 4,352,690 A | * | 10/1982 | Dettke et al. | 427/437 |
| 5,380,562 A | * | 1/1995 | Hattori et al. | 427/304 |
| 5,785,570 A | * | 7/1998 | Bruni | 313/496 |

FOREIGN PATENT DOCUMENTS

JP  5222541  8/1993

\* cited by examiner

*Primary Examiner*—Mark Kopec
*Assistant Examiner*—K Vijayakumar
(74) *Attorney, Agent, or Firm*—Ladas & Parry

(57) ABSTRACT

An neutral electroless gold plating method that minimises "black band" corrosion problem in the final product. The electroless gold plating solution is provided at neutral pH in the presence of a reducing agent, a complexing agent and an accelerator to allow a gold layer of the desired thickness to be plated under manufacturing conditions The gold layer produced thereof has good bondability and solderability.

18 Claims, No Drawings

ELECTROLESS GOLD PLATED ELECTRONIC COMPONENTS AND METHOD OF PRODUCING THE SAME

FIELD OF THE INVENTION

The present invention relates to electroless gold plating, In particular, the present invention relates electroless gold plating at neutral pH.

BACKGROUND OF THE INVENTION

The techniques for producing suitable metallic coating such as metallic pads for the electrical connection between electronic components are becoming increasingly demanding as the sophistication of electronic components Increases. For example, special printed circuit boards (PCBs) with non-conducted circuitry are often required for the fabrication of chip on board, ball grid array packages, multi-chip modules and chip scale packages. In many applications, gold pads are required for use in wire bonding or soldering techniques to interconnect the various electronic components.

Different methods exist in the art for producing gold pads for wire bonding or soldering. They are commonly divided into the electroless techniques and the electrolytic (Ely) techniques In both techniques, a barrier layer of metal is first deposited on the copper layer. The barrier layer is typically Ni2P for electroless techniques, and metallic nickel for electrolytic techniques. This is followed by deposition of the gold layer, Eleltroless gold techniques are in turn subdivided into the immersion gold methods and the reducing electroless gold (ES) methods.

Immersion gold methods involve a direct displacement reaction between gold ions and metallic nickel whereby, ionic gold becomes reduced while metallic nickel becomes oxidised. The technique typically involves a preliminary step of electroless plating of a nickel/phosphorus alloy ($Ni_2P$) onto a substrate such as a PCB board or other electronic components using the following reaction:

$$4Ni^{2+}+8H_2PO_2^-+2H_2O \rightarrow 6H_2PO_3^-+2Ni_2P+H_2(g)+6H^+$$

The $Ni_2P$ plated substrate is then submerged in an immersion gold solution for the following redox reaction:

$$Ni_2P+4[Au(CN)_2]^- \rightarrow 4\,Au+P+2[Ni(CN)_4]^{2-}$$

This two-step plating process is referred to as electroless nickel/immersion gold (ESN/IG) process. This reaction typically does not require a reducing agent, An ESN/IG plated pad (e.g. an input/output (I/O) pad on a PCB) is useful for soldering and aluminium wire bonding. However, the immersion reaction to deposit elemental gold onto the nickel plating causes oxidation and corrosion of the $Ni_2P$ deposit, resulting in the presence of a "black band" at the interface between the nickel layer and the gold layer. This gives poor results in gold wire bonding.

To improve gold wire bondability, JP 5222541 discloses a method in which a third electroless gold plating step (ESG) is performed after the above-described process i.e. ESN/IG/ESG. The general reaction for the ESG step is typically performed at acidic pH in the presence of a reducing agent:

$$2[Au(CN)_2]^-+H_2PO_2^-+H_2O \rightarrow 2Au+H_2PO_3^-+4CN^-+H_2$$

The additional gold layer gives good bondability if the thickness of the ESG gold layer is 80 μin or above, provided the thickness of the intermediate IG gold layer is carefully controlled to around 0.1 μm, otherwise solderability is compromised. Furthermore, the undesirable "black band" corrosion problem remains unsolved.

To solve the "black band" corrosion problem, JP 98438 proposes the use of electroless palladium step before the immersion gold step (ESN/ESPd/IG). The pads produced by this method have good gold wire bondability, but poor solderability. Furthermore, the thickness required for the palladium layer is quite high, and the use of two precious metals result in high costs.

The only method currently known in the art to produce metal pads that have both good solderability and good gold wire bondability is electrolytic soft gold plating. This method, however, require that the plating surfaces be electrically connected for electrolysis, thus posing a severe limitation on board design. Furthermore, the thickness of the gold deposit lacks uniformity, being directly dependent on the distribution of current density.

It is therefore an object of the present invention to provide a method of producing a metallic layer that is solves the aforementioned prior art problems.

SUMMARY OF THE INVENTION

Accordingly, the present invention provided, in one aspect, an electroless gold plating method that minimises "black band" corrosion problem in the art. The electroless gold plating reaction according to present invention (referred to hereinafter as EG-1) may be performed on a typical $Ni_2P$ plated layer on a substrate. The EG-1 electroless gold plating solution is provided at neutral pH in the presence of a reducing agent to prevent corrosion of the $Ni_2P$ plating on the substrate, and a complexing agent to maintain the gold ions in solution. The solution is further provided with an accelerator to increase the rate of reduction, and to allow a gold layer of the desired thickness to be plated under manufacturing conditions. The product produced therefrom contains a substrate having a first $Ni_2P$ layer plated by conventional electroless Nickel plating, and a second gold layer plated above the $Ni_2P$ layer in the absence of a black band of phosphorus when traverse cross-section of the product is observed under a scanning electron microscope of up to 10,000× magnification and using the technique of Energy Dispersive x-ray (EDX).

In a further aspect of the present invention, a second electroless gold plating step (hereinafter referred to as EG-2) is provided after EG-1 to further increase the thickness and purity of the gold layer. The plating solution for EG-2 may be the same the EG-1, or the gold ion concentration is preferably higher. The product produced thereof is also a substrate with a gold layer plated on a $Ni_2P$ layer in the absence of a phosphorus black band.

The thickness of the gold layer plated according to the present method need only be 10–20 μin to achieve both good solderability and good gold wire bondability. This is thinner than the conventional soft gold pads, which typically require 25 μin thickness or higher.

The gold pad produced according to the present method possesses both excellent bondability and solderability.

DESCRIPTION OF THE INVENTION

The following detailed description describes the preferred embodiment for implementing the underlying principles of the present invention. One skilled in the art should understand, however, that the following description is meant to be illustrative of the present invention, and should not be construed as limiting the principles discussed herein. In the following discussion, and in the claims the terms "including", "having" and "comprising" are used in an open-ended fashion, and thus should be interpreted to mean "including but not limited to . . . ". As used herein, electronic components include electronic devices, integrated circuit devices, and printed circuit boards. Substrate include dielectric material, epoxy and other material commonly used for packaging electronic circuitry and devices.

The electroless gold plating method according to the present invention is preferably used on a conventional electroless $Ni_2P$ deposition onto a substrate surface. The $Ni_2P$ acts as a barrier layer to protect the copper traces in the substrate. The substrate is typically made from organic material, e.g. epoxy or dielectric material for PCB fabrication. The $Ni_2P$ deposition is performed by first cleaning the substrate by acid, followed by microetching to expose the surfaces to be plated. After treatment in an acid bath, the surface to be plated is then activated before electroless nickel plating occurs. The general reaction is as follows:

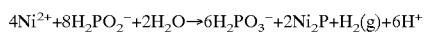

$$4Ni^{2+}+8H_2PO_2^-+2H_2O \rightarrow 6H_2PO_3^-+2Ni_2P+H_2(g)+6H^+$$

This is followed by electroless gold plating (EG-1) in a solution containing $KAu(CN)_2$, citrate salt as the complexing agent, sodium hypophosphite as the reducing agent, and thallium salt as the accelerator. The solution is maintain at a pH of between 6.5 to 7.0 and the reaction allowed to occur for 1–12 minutes, For a thicker layer of gold, a second electroless gold plating step (EG-2) may be performed by submerging in a solution containing the same components as the EG-1 solution, or a solution with a higher $KAu(CN)_2$ concentration. The citrate salt may be any salt of citrate including but not limited to sodium, potassium or ammonium salt. Citrate also functions as a buffer to maintain the solution at neutral or near-neutral pH. The Thallium salt may be any salt of Thallium, including but not limited to chloride, bromide or acetate salt. The following examples describes the detailed process of the present invention:

EXAMPLE 1

TABLE 1

| STEP | SOLUTION | TEMP (° C.) | INCUBATION TIME (minutes) |
| --- | --- | --- | --- |
| 1. Acid cleaning | AF Cleaner 40–60 mL/L (Autotech S.E.A. Pte Ltd.) 98% $H_2SO_4$ 80–100 mL/L | 40–45 | 3–7 |
| 2. Microetching | $Na_2S_2O_8$ 80–120 g/L 98% $H_2SO_4$ 20–60 mL/L | ambient | 1–5 |
| 3. Acid dip | 98% $H_2SO_4$ 20–60 mL/L | ambient | 2–4 |
| 4. Activation | Aurotech Activator 180–220 mL/L (From Autotech S.E.A. Pte Ltd.) 98% $H_2SO_4$ 40–60 mL/L | 20–25 | 1–3 |
| 5. Electroless Nickel plating (ESN) | Aurotech CNN-mod 140–160 mL/L Aurotech CNN-Part A 50–70 mL/L 24% Ammonia water 10–30 mL/L pH 4.8–5.3 | 80–90 | 20–30 |
| 6. Electroless gold (EG-1) | $KAu(CN)_2$ 2–6 g/L Sodium citrate 20–200 g/L $NaH_2PO_2$ 10–80 g/L Thallium chloride 10–100 ppm pH 6.5–7.0 | 85–95 | 1–12 |

Table 1 shows an example of the process according to the present invention. A concentration range is given for each component of each solution within which the present invention may be practised. Steps 1 to 5 are conventional steps for electroless nickel plating according to Autotech S.E.A. Pte Ltd. and may be substituted for systems by other suppliers, e.g. by Uyemura & Co Ltd, Shipley-Ronal Singapore Pte. Ltd.

EXAMPLE 2

TABLE 2

| STEP | SOLUTION | TEMP (° C.) | INCUBATION TIME (minutes) |
| --- | --- | --- | --- |
| 6. Electroless gold (EG-1) | $KAu(CN)_2$ 4 g/L Sodium citrate 120 g/L $NaH_2PO_2$ 25 g/L Thallium chloride 40 ppm pH 6.7 | 90 | 12 |

Table 2 shows another example of the electroless gold plating process, with the first five steps identical to those shown in Table 2. Following this example, a gold layer of approximately 2–5 μin thickness may be obtained over the $Ni_2P$ layer without visible corrosion. Visible corrosion is determined by the microscopic viewing a cross-sectional sample of a plated substrate traversing the various layers. The viewing is performed by a scanning electron microscope using EDX technique at up to 10,000× magnification.

EXAMPLE 3

TABLE 3

| STEP | SOLUTION | TEMP (° C.) | INCUBATION TIME (minutes) |
|---|---|---|---|
| 6. Electroless gold (EG-1) | $KAu(CN)_2$ 2–6 g/L<br>Sodium citrate 20–200 g/L<br>$NaH_2PO_2$ 10–80 g/L<br>Thallium chloride 10–100 ppm<br>pH 6.5–7.0 | 85–95 | 1–12 |
| 7. Electroless gold (EG-2) | $KAu(CN)_2$ 3–12 g/L<br>Sodium citrate salt 20–200 g/L<br>$NaH_2PO_2$ 10–80 g/L<br>Thallium chloride 10–100 ppm<br>pH 6.5–7.0 | 85–95 | 10–100 |

Table 3 shows a further example of an electroless gold plating method according to the present example in which EG-2 (step 7) is used after EG-1 (step 6). The first 5 steps are identical to Example 1, and may be substituted for other $Ni_2P$ plating systems as discussed. The concentration and working ranges are indicated.

EXAMPLE 4

TABLE 4

| STEP | SOLUTION | TEMP (° C.) | INCUBATION TIME (minutes) |
|---|---|---|---|
| 6. Electroless gold (EG-1) | $KAu(CN)_2$ 4 g/L<br>Sodium citrate 120 g/L<br>$NaH_2PO_2$ 25 g/L<br>Thallium chloride 40 ppm<br>pH 6.7 | 90 | 1 |
| 7. Electroless gold (EG-2) | $KAu(CN)_2$ 10 g/L<br>Sodium citrate 180 g/L<br>$NaH_2PO_2$ 40 g/L<br>Thallium chloride 60 ppm<br>pH 6.7 | 92 | 40 |

Table 4 shows a further example of a method according to the present invention. Steps 1–5 are identical to those of Example 1. Using the specific method and solution provided in this example, a gold layer of 30 μin may be obtained.

Table 5 below summarises the microscopy results of the present method in Example 4 compared to prior art methods.

TABLE 5

| METHOD | BLACK BAND | CORROSION |
|---|---|---|
| ESN/IG (12 min., pH 4.5) (Prior art) | Yes | Yes |
| ESN/IG (12 min., pH 4.0) (Prior art) | Serious | Serious |
| ESN/EG-1 (12 min., pH 7.0) | No | No |
| ESN/EG-1 (12 min., pH 7.0)/ EG-2 (12 min., pH 6.7) | No | No |

Table 6 summarises results of bondability tests of products produced by various methods. The bonding test method involves the use of gold wires with one end (end "a") bonded to a gold ball of a component, and the other end bonded to a gold pad under test. During the testing process, the prescribed gold wire is pulled at increasing force until a break occurs. If the break occurs at the wire, then the failure mode is at points b,c or d. If the break point is at the gold ball end or the bonded gold pad end, the failure mode is referred to as mode "a" or "e" respectively. Results in Table 6 below show that bondability of a gold pad produced according to Example 4 is superior to the prior art EN/IG method.

TABLE 6

| Finish Type | ESN/IG (Prior Art) | ESN/ESPd/IG (Prior Art) | ElyN/ElyAu (Prior Art) | EN/EG-1/EG-2 (Example 4) |
|---|---|---|---|---|
| Thickness of each metal layer (μin) | 179/4.2 | 207/30/3.7 | 366/30 | 278/0.5/28.6 |
| Average pull strength (g) | 11.0 | 11.6 | 12.2 | 11.7 |
| Failure Mode "a" | 8 | 0 | 0 | 0 |
| Failure Mode "b" | 0 | 2 | 2 | 2 |
| Failure Mode "c" | 32 | 58 | 58 | 58 |
| Failure Mode "d" | 0 | 0 | 0 | 0 |
| Failure Mode "e" | 2 | 0 | 0 | 0 |
| Bonding property | Poor | Good | Good | Good |

Table 7 below show results of ball shear testing to compare the solderability of gold pads produced by different methods. Ball shear testing involves the use of a shearing arm positioned adjacent the prescribe solder ball. The prescribed solder ball is soldered by conventional reflow methods onto the gold pad under testing. The shearing arm is used to produce an increasing lateral shear force on the prescribed solder ball until breakage occurs. Failure mode "1" refers to breakage occurring at the solder joint. While failure mode "2" refers to a breakage of the ball itself. Table 7 shows that solder joints using electrolytic soft gold plating has the highest shear strength, exceeding 1,300 g. The ESN/EG-1/EG-2 method according to Example 4 also possesses good shear strength with an average exceeding 1,000 g. Industry standard requirement for shear strength is a minimum of 800 g for solder joints.

TABLE 7

| Finish Type | ESN/IG (Prior Art) | ESN/ESPd/IG (Prior Art) | ElyN/ElyAu (Prior Art) | EN/EG-1/EG-2 (Example 4) |
|---|---|---|---|---|
| Thickness of each metallic layer (μin) | 180/4.0 | 180/30/10 | 500/30 | 300/0.5/25 |
| Average Shear strength (g) | 858 | 530 | 1373 | 1093 |
| Failure Mode | 1 | 1 | 2 | 1 |

The test results described above were obtained from gold pads produced according to the present invention with a total gold thickness of at least 25 μin. In order to determine if the thickness of the gold layer of the present invention may be reduced, further tests were conducted. Table 8 below shows the effect of increasing thickness of the gold layer produced according to the present method (ESN/EG-1/EG-2 as described in Example 4) on bonding property. Gold wire bonding test was conducted as described for the method used in Table 6. These results show that good bondability is achieved even at a total thickness of only 10 μin.

Table 9 below shows the effect of increasing thickness of the gold layer produced according to the present method (ESN/EG-1/EG-2 as described in Example 4) on solder joint strength. The $Ni_2P$ layer produced by ESN is kept at 300 µin in all cases. Solder ball testing was performed as described for Table 7. Results indicate that even at a thickness of only 2 µin, gild pads produced according to the present invention exceed the industry standard requirement of 800 g.

TABLE 8

| Total thickness of gold layer (µin) | Average pull strength | Failure mode | Bondability |
| --- | --- | --- | --- |
| 8 | 14.21 | b and e | Poor |
| 10 | 15.06 | b only | Good |
| 13 | 14.77 | b only | Good |
| 16 | 13.89 | b only | Good |
| 18 | 13.89 | b only | Good |
| 20 | 13.34 | b only | Good |
| 22 | 13.55 | b only | Good |
| 27 | 14.29 | b only | Good |

TABLE 9

| EG-1/EG-2 Total thickness (µin) | Average shear strength | Failure Mode |
| --- | --- | --- |
| 25 | 1093 | 1 |
| 5 | 972 | 1 |
| 2 | 1004 | 1 |

The above results indicate that good solderability and gold wire bondability can be achieved by the an electroless gold plating method according to the present invention. The thickness of the gold layer in the gold pad produced thereof may be as thin as 10 µin, and still be able to meet the minimum industry standard for shear strength and pull strength.

What is claimed is:

1. An electroless gold plating solution comprising $KAu(CN)_2$; a gold ion reducing agent for reducing gold ions to gold element; a gold ion reduction accelerator for accelerating the rate of reduction of gold ions to gold element; and a complexing agent for maintaining the solubility of the gold ions; said solution maintained at pH 6.5–7.0.

2. An electroless gold plating solution according to claim 1 wherein said gold ion reducing agent is $NaH_2PO_2$.

3. An electroless gold plating solution according to claim 1 wherein said gold ion reduction accelerator comprises Thallium salt.

4. An electroless gold plating solution according to claim 1 wherein said complexing agent comprises citrate.

5. An electroless gold plating solution according to claim 1 wherein said gold ion reducing agent is $NaH_2PO_2$; said gold ion reduction accelerator comprises a chloride, bromide or acetate salt of Thallium; and said complexing agent comprises a sodium, potassium or ammonium salt of citrate.

6. An electroless gold plating solution comprising 2–12 g/L $KAu(CN)_2$; 10–80 g/L $NaH_2PO_2$; 10–100 ppm of a Thallium salt; 20–200 g/L of citrate; said solution maintained at pH 6.5–7.0.

7. An electroless gold plating solution according to claim 6 wherein the concentration of said $KAu(CN)_2$ is 2–4 g/L; the concentration of said $NaH_2PO_2$ is 20–30 g/L; the concentration of said Thallium salt is 30–50 ppm; the concentration of said citrate salt is 120–140 g/L, said solution buffered to pH 6.5–7.0.

8. An electroless gold plating solution according to claim 6 wherein the concentration of said $KAu(CN)_2$ is 4–10 g/L; the concentration of said $NaH_2PO_2$ is 20–30 g/L; the concentration of said Thallium salt is 50–70 ppm; and the concentration of laid citrate salt is 120–180 g/L; said solution buffered to pH 6.5–7.0.

9. An electroless gold plating method comprising incubating a substrate at 85–95° C. for 1–60 minutes in a solution containing 2–12 g/L $KAu(CN)_2$; 10–80 g/L $NaH_2PO_2$, 10–100 ppm of a Thallium salt; and 20–200 g/L a citrate salt; said solution buffered to pH 6.5–7.0.

10. An electroless gold plating method according to claim 9 further comprising the additional steps of rinsing said substrate and incubating said substrate at 85–95° C. for 1–60 minutes in a second solution containing 2–12 g/L $KAu(CN)_2$; 10–80 g/L $NaH_2PO_2$; 10–100 ppm of a Thallium salt; and 20–200 g/L of a citrate salt; said second solution buffered to pH 6.5–7.0.

11. A method of producing at least one gold layer on a barrier layer of an electronic substrate, said method comprising: electroless plating a gold layer onto prescribed surfaces of said barrier layer of said substrate by using a gold solution at pH 6.5–7.0, said gold solution comprising $KAu(CN)_2$; a gold ion reducing agent for reducing gold ions to gold element; a gold ion reduction accelerator for accelerating the rate of reduction of gold ions to gold element; and a complexing agent for maintaining the solubility of the gold ions; and said solution further preventing the corrosion of said barrier layer.

12. A method according to claim 11 wherein said barrier layer consists essentially of $Ni_2P$.

13. A method according to claim 11 wherein said gold solution contains $KAu(CN)_2$.

14. A method according to claim 11 wherein said gold solution contains 2–12 g/L $KAu(CN)_2$.

15. A method according to claim 11 wherein said accelerator is Thallium chloride, bromide or acetate.

16. A method according to claim 11 wherein said accelerator is 10–100 ppm Thallium chloride, bromide or acetate.

17. A method according to claim 11 wherein said reducing agent is sodium, potassium or ammonium citrate.

18. A method according to claim 11 wherein said reducing agent is 20–200 g/L sodium, potassium or ammonium citrate.

* * * * *